United States Patent [19]

Avery

[11] Patent Number: 5,708,550
[45] Date of Patent: Jan. 13, 1998

[54] ESD PROTECTION FOR OVERVOLTAGE FRIENDLY INPUT/OUTPUT CIRCUITS

[75] Inventor: Leslie Ronald Avery, Flemington, N.J.

[73] Assignee: David Sarnoff Research Center, Inc., Princeton, N.J.

[21] Appl. No.: 736,113

[22] Filed: Oct. 24, 1996

Related U.S. Application Data

[60] Provisional application No. 60/007,069 Oct. 25, 1995.
[51] Int. Cl.$^6$ .................................... H02H 9/00
[52] U.S. Cl. .................................. 361/56; 361/111
[58] Field of Search ...................... 361/56, 111, 91, 361/110

[56] References Cited

U.S. PATENT DOCUMENTS

| | | | |
|---|---|---|---|
| 4,875,130 | 10/1989 | Huard | 361/56 |
| 4,922,371 | 5/1990 | Gray et al. | 361/91 |
| 5,043,782 | 8/1991 | Avery | 257/362 |
| 5,276,582 | 1/1994 | Merrill et al. | 361/111 |
| 5,343,053 | 8/1994 | Avery | 257/173 |
| 5,412,527 | 5/1995 | Husher | 361/56 |
| 5,493,133 | 2/1996 | Duvvury et al. | 257/111 |
| 5,514,612 | 5/1996 | Rao et al. | 437/51 |
| 5,515,225 | 5/1996 | Gens et al. | 361/56 |
| 5,600,525 | 2/1997 | Avery | 361/56 |
| 5,633,773 | 5/1997 | Suur-Askola | 361/56 |

OTHER PUBLICATIONS

Copy of International Search Report dated Feb. 21, 1997, from corresponding international application.

*Primary Examiner*—Jeffrey A. Gaffin
*Assistant Examiner*—Michael J. Sherry
*Attorney, Agent, or Firm*—William J. Burke

[57] ABSTRACT

An electrostatic discharge (ESD) protection circuit includes an input terminal, a power supply line and a source of reference potential. The circuit also includes a dummy supply line. A Schottky barrier diode is connected between the input terminal and the power supply line for blocking voltages from the input terminal which are greater than the power supply voltage. A first clamping structure is connected between the dummy supply line and the source of reference potential, and a second clamping structure is connected between the power supply line and the source of reference potential. A first clamping diode is connected between the input terminal and the dummy supply line and a second clamping diode is connected between the input terminal and the source of reference potential.

8 Claims, 1 Drawing Sheet

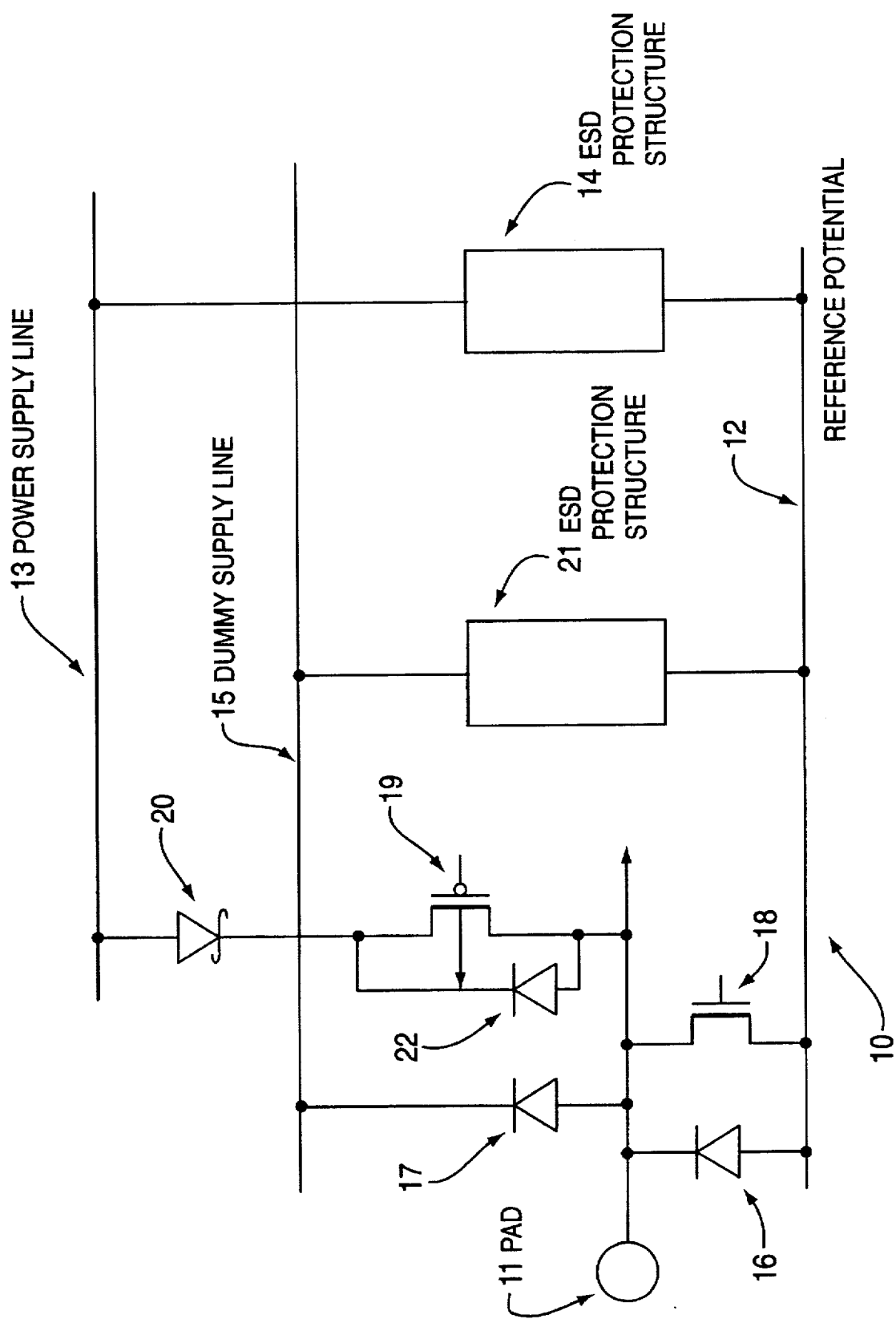

ESD PROTECTION FOR OVERVOLTAGE FRIENDLY INPUT/OUTPUT CIRCUITS

RELATED APPLICATIONS

This application claims the benefit of U.S. Provisional application Ser. No. 60/007,069, filed Oct. 25, 1995 abandoned.

FIELD OF THE INVENTION

The present invention is directed to an electrostatic discharge (ESD) protection circuit, and, more particularly to an ESD protection circuit for overvoltage friendly input/output circuits.

BACKGROUND

For an integrated circuit (IC) fabricated using geometries below about 0.5 micrometers, the input and bidirectional input/output (I/O) circuits have to withstand an input voltage which can exceed the IC supply voltage. For example, the IC may operated from 3.3 volts, but must have the ability to interface with other circuits having 5 volt logic swings. This ability is commonly called 5 volt friendly. Electrostatic discharge (ESD) protection for these circuits is more difficult as a simple diode protection to the supply line clamps the signal at the terminal to a diode drop above the supply line voltage, or 4 volts in the case of 3.3 volt supplies. The use of a single protection structure to the common reference potential is undesirable since it requires a large silicon area as the structure must absorb all the ESD energy.

SUMMARY OF THE INVENTION

An ESD protection circuit includes an input terminal, a power supply line for providing a power supply voltage, and a source of reference potential. A Schottky varrier diode is between the input terminal and the power supply line for blocking voltages from the input terminal which are greater than the power supply voltage. A clamping circuit is provided for clamping excess positive voltage at a higher voltage than the power voltage. A first clamping means is between the input terminal and the clamping circuit, and a second clamping means is provided for clamping negative voltages at the input terminal to the source of reference potential.

BRIEF DESCRIPTION OF THE DRAWING

The FIGURE of the drawings is a schematic diagram of an I/O circuit with ESD protection in accordance with the present invention.

DETAILED DESCRIPTION

Referring to the FIGURE of the drawings there is shown a schematic diagram of an I/O circuit 10 which includes NMOS transistor 18 and PMOS transistor 19. The drains of the transistors 18 and 19 are connected to an I/O terminal pad 11. The source of the NMOS transistor 18 is connected to a source of reference potential 12. The source of the PMOS transistor 19 is connected to the cathode of a Schottky diode 20. The anode of the Schottky diode 20 is connected to a power supply line 13. Power supply protection structure 14 is connected between the power supply line 13 and the source of reference potential 12. A diode 16 is connected between the pad 11 and the source of reference potential 12, with the anode of the diode 16 being connected to the source of reference potential 12, and the cathode of the diode 16 being connected to the terminal pad 11. A diode 17 is connected between the terminal pad 11 and a dummy supply line 15. The anode of diode 17 is connected to the terminal pad 11, and the cathode of the diode 17 is connected to the dummy supply line 15. A power supply protection structure 21 is connected between the source of reference potential 12 and the dummy supply line 15. A diode 22 is shown connected between the source and drain of the PMOS transistor 19. The diode 22 is a parasitic diode present in a bulk CMOS device, and is formed by the drain of PMOS transistor 19 and an N-well or bulk silicon body in which the circuit is formed.

ESD protection structures 14 and 21 can be those commonly used in the art, such as high holding voltage SCRs, lateral npn transistors, vertical npn transistors, shunt regulators, etc., which are designed to clamp the ESD transient to a safe level once the structure is triggered. Ideally, the ESD protection structure 14 is of the type which will trigger within two or three volts above the maximum allowable supply voltage, and snap-back to a holding voltage which is only one or two volts above the maximum allowable supply voltage. The ESD protection structure 21 should be of a structure which will trigger about one diode forward drop below the maximum logic level, normally about 5.5 volts, and clamp at that voltage. My U.S. Pat. No. 5,043,782, my U.S. Pat. No. 5,343,053 and my U.S. Pat. No. 5,600,525, each of which is incorporated herein by reference, disclose applicable power supply protection structures.

In normal operation as an output circuit, NMOS transistor 18 provides the pull down capability, sinking current to the source of reference potential. PMOS transistor 19 provides the pull up capability, sourcing current through the Schottky diode 20 from the power line 13 into the external load and raising the potential on terminal pad 11. The potential on terminal pad 11 reaches a value slightly below the potential of the power line 13 due to the forward voltage drop of the Schottky diode 20. This voltage drop depends on the metal used to form the Schottky diode 20, but is normally less than about 0.4 volts.

When operating as an input circuit receiving signals from an external source, NMOS transistor 18 and PMOS transistor 19 are switched to the off state by internal logic control signals, and terminal pad 11 acts an in input terminal. The I/O pad 11 is connected to the gates of input transistors via resistor/protection networks well known in the art. For logic signal within a range from the source of reference potential minus one diode drop (nominally about −0.6 volts) to the trigger potential of ESD protection structure 21 plus the forward voltage of diode 17, all protection elements and MOS devices appear to be open circuit.

If the input signal or a transient causes the potential at terminal pad 11 to fall more than one forward diode voltage below the source of reference potential, diode 16 conducts, clamping the signal or transient to the source of reference potential. Diode 16 turns off when the signal or transient rises above the forward voltage drop of diode 16.

If the input signal rises a forward diode voltage drop above the voltage on power supply line 13, the Schottky diode 20 becomes reversed biased and turns off, thereby preventing current from flowing through the parasitic diode 22 to the power supply line 13. If the voltage at terminal pad 11 continues to rise, a point is reached where diode 17 becomes forward biased and protection structure 21 is triggered. The input is then clamped to the clamping voltage of protection structure 21 plus the forward voltage drop of diode 17. Protection structure 21 and diode 17 turn off when the input signal or transient fall below the combined clamping voltage of structure 21 and diode 17.

This arrangement can be used for both bulk silicon and oxide isolated processes in which diode 22 does not exist. However, PMOS transistor 19 could still be turned on by having the gate voltage held at a fixed potential while the drain, which is connected to terminal pad 11, is taken to a higher potential than the gate. Under these bias conditions, the drain and source of the PMOS transistor 19 are reversed and current could flow from the terminal pad 11 into power supply line 13. The presence of The Schottky diode 20 prevents this flow of current.

It is to be understood that the apparatus and method of operation taught herein are illustrative of the invention. Modifications may readily be devised by those skilled in the art without departing from the spirit or scope of the invention. The invention is an ESD protection circuit whereby any potential source of current flow from an input terminal into the power supply line by voltages exceeding the power supply voltage is blocked by a Schottky diode. A first clamping means is introduced between the input terminal and a clamp circuit enables excess positive voltage to be clamped at a higher voltage than the power supply voltage. A second clamping means is provided whereby negative voltages at the input terminal are clamped to a source of reference potential. The first and second clamping means are semiconductor diodes, but any other types of structures can be used which turn on above a certain voltage to connect the signal line to a dummy supply line. The clamp circuit of the present invention may be shared between one or more input circuits or input/output circuits connected with a dummy supply line. The Schottky diode is typically formed by introducing a metal or metal-silicide contact into an N-well.

The use of a dummy supply line with distributed ESD protection structures designed to accommodate signal levels, e.g., above about 5 volts, greater than the power supply voltage, e.g., about 3.3 volts, with ESD protection and with diodes from each input or I/O circuit to this dummy supply line is disclosed.

What is claimed is:

1. An ESD protection circuit comprising:

an input terminal;

power supply line for providing a power supply voltage;

a source of reference potential;

a Schottky barrier diode between the input terminal and the power supply line for blocking voltages from the input terminal which are greater than the power supply voltage;

a clamping circuit for clamping excess positive voltage at a higher voltage than the power voltage;

first clamping means between the input terminal and the clamping circuit; and second clamping means for clamping negative voltages at the input terminal to the source of reference potential.

2. An ESD protection circuit in accordance with claim 1 including a dummy supply line and a first portion of the clamping circuit is connected between the dummy supply line and the source of reference potential.

3. An ESD protection circuit in accordance with claim 2 in which a second portion of the clamping circuit is connected between the power supply line and the source of reference potential.

4. An ESD protection circuit in accordance with claim 3 in which the first clamping means is a semiconductor diode connected between the input terminal and the dummy line.

5. An ESD protection circuit in accordance with claim 4 in which the second clamping means is a semiconductor diode connected between the input terminal and the source of reference potential.

6. The ESD protection circuit in accordance with claim 5 in which each portion of the clamping circuit is a separate ESD protection structure.

7. The ESD protection circuit in accordance with claim 6 in which the first portion of the clamping circuit is an ESD protection structure which will trigger within two to three volts above the maximum allowable supply voltage and will snap-back to a holding voltage which is only one to two volts above the maximum allowable supply voltage.

8. The ESD protection circuit in accordance with claim 7 in which the second portion of the clamping circuit is an ESD protection structure which triggers at about one diode forward voltage drop below the maximum logic level and clamps at that voltage.

* * * * *